(12) United States Patent
Kinsey et al.

(10) Patent No.: US 11,211,510 B2
(45) Date of Patent: Dec. 28, 2021

(54) MULTIJUNCTION SOLAR CELL WITH BONDED TRANSPARENT CONDUCTIVE INTERLAYER

(75) Inventors: Geoffrey S. Kinsey, Pasadena, CA (US); Richard R. King, Thousand Oaks, CA (US); Hojun Yoon, Stevenson Ranch, CA (US); Denton W. McAlister, Los Angeles, CA (US)

(73) Assignee: THE BOEING COMPANY, Chicago, IL (US)

( * ) Notice: Subject to any disclaimer, the term of this patent is extended or adjusted under 35 U.S.C. 154(b) by 2420 days.

(21) Appl. No.: 11/301,529

(22) Filed: Dec. 13, 2005

(65) Prior Publication Data

US 2007/0131275 A1   Jun. 14, 2007

(51) Int. Cl.
| | |
|---|---|
| H01L 31/0725 | (2012.01) |
| H01L 31/076 | (2012.01) |
| H01L 31/0687 | (2012.01) |
| H01L 31/18 | (2006.01) |
| H01L 31/0224 | (2006.01) |

(52) U.S. Cl.
CPC .. *H01L 31/0725* (2013.01); *H01L 31/022466* (2013.01); *H01L 31/0687* (2013.01); *H01L 31/076* (2013.01); *H01L 31/1884* (2013.01); *Y02E 10/544* (2013.01); *Y02E 10/547* (2013.01); *Y02E 10/548* (2013.01)

(58) Field of Classification Search
USPC ............................................. 136/255, 256
See application file for complete search history.

(56) References Cited

U.S. PATENT DOCUMENTS

| | | | | |
|---|---|---|---|---|
| 4,643,817 A | * | 2/1987 | Appleby | .................. C25B 1/55 |
| | | | | 204/242 |
| 5,403,404 A | * | 4/1995 | Arya et al. | .................... 136/249 |

(Continued)

FOREIGN PATENT DOCUMENTS

| | | |
|---|---|---|
| EP | 1109230 | 6/2001 |
| EP | 1724840 | 11/2006 |

(Continued)

OTHER PUBLICATIONS

Meyers, P.V. et al.: "Polycrystalline CdTe on CuInSe2 Cascaded Solar Cells": The Conference Record of the Twentieth IEEE Photovoltaic Specialists Conference; vol. 2, Sep. 26, 1988, pp. 1448-1451.

(Continued)

*Primary Examiner* — Dustin Q Dam
(74) *Attorney, Agent, or Firm* — Gates & Cooper LLP

(57) ABSTRACT

Methods and apparatuses for creating solar cell assemblies with bonded interlayers are disclosed. In summary, the present invention describes an apparatus and method for making a solar cell assembly with transparent conductive bonding interlayers. An apparatus in accordance with the present invention comprises a substrate, a first solar cell, coupled to a first side of the substrate, wherein the first solar cell comprises a first Transparent Conductive Coating (TCC) layer coupled to a first polarity electrode of the first solar cell, and a second solar cell, the second solar cell being bonded to the first solar cell by bonding the first TCC layer to the second solar cell.

26 Claims, 5 Drawing Sheets

(56) References Cited

U.S. PATENT DOCUMENTS

| | | | | |
|---|---|---|---|---|
| 2004/0045598 | A1* | 3/2004 | Narayanan | H01L 31/03046 136/255 |
| 2004/0200523 | A1* | 10/2004 | King et al. | 136/262 |
| 2005/0239660 | A1* | 10/2005 | Abe | C04B 35/01 505/475 |
| 2007/0151596 | A1* | 7/2007 | Nasuno | H01L 31/076 136/256 |
| 2007/0251570 | A1* | 11/2007 | Eckert et al. | 136/256 |
| 2009/0000655 | A1* | 1/2009 | Skryabin et al. | 136/251 |

FOREIGN PATENT DOCUMENTS

| | | |
|---|---|---|
| FR | 2777116 | 10/1999 |
| JP | 4127580 | 4/1992 |
| JP | 2004 319934 | 11/2004 |
| WO | 2005/081324 | 9/2005 |

OTHER PUBLICATIONS

Sharps, P.R. et al.: "Wafer Bonding for Use in Mechanically Stacked Multi-Bandgap Cells", Conference Record of the 26th IEEE Photovoltaic Specialists Conference; Sep. 29, 1987, pp. 895-898.

Wallace, W. et al.: "Advances in Material/Cell/Submodule Research in the DOE/SERI Amorphous Silicon Research Project", The Conference Record of the Twentieth IEEE Photovoltaic Specialists Conference; vol. 1, Sep. 26, 1988, pp. 328-334.

Extended European Search Report for EP Application No. 06077168.0 dated Apr. 15, 2011.

Sharps P R et al., "Wafer bonding for use in mechanically stacked multi-bandgap cells". Conference Record of the 26th IEEE Photovoltaic Specialists Conference, Sep. 29, 1997, pp. 895-898.

Partial European Search Report dated Apr. 26, 2016 for European application No. EP14166914.3.

European Communication dated May 22, 2017 for European Patent Application No. 14166914.3.

European Summons to Attend Oral Proceedings dated Apr. 20, 2020 for European Patent Application No. 14166914.3.

\* cited by examiner

MULTIJUNCTION SOLAR CELL WITH BONDED TRANSPARENT CONDUCTIVE INTERLAYER

BACKGROUND OF THE INVENTION

1. Field of the Invention

The present invention relates to devices and methods for making semiconductor devices, and in particular to a device and method for making a multijunction solar cell with a transparent conductive interlayer.

2. Description of the Related Art

Solar cells are used in various technologies to provide power to other electronic assemblies. Satellites, calculators, and power systems are all examples of solar cell usage.

A solar cell is a p-n junction created over a large area on a semiconductor substrate. The junction creates a voltage and current when light of certain wavelengths strike the surface of the solar cell, and, as such, solar cells are photovoltaic devices. These photovoltaic cells provide a lightweight, maintenance-free power source for various applications, and also provide a pollution-free, distributed energy generation source for use in power delivery systems.

Typical high-efficiency multijunction solar cells utilize different types of materials that are grown monolithically onto a substrate. Different materials are used to absorb different wavelengths of light in the spectrum, each material chosen to absorb a specific range of wavelengths such that the cell can be more efficient. Several such subcells are combined to form a multijunction cell. To be able to grow such materials, the lattice constants of the materials being grown must be closely matched to each other. If the lattice constants are not closely matched, the material being grown will not be of high crystal quality, thereby reducing or eliminating the photovoltaic nature of the material. As such, the types of materials that can be grown on a given substrate are limited.

Alternatively, different solar cell materials may be bonded together. The bond must be electrically conductive, optically transparent, and strong enough to prevent separation of the different materials. To date, bonded solar cell materials have lacked at least one of these three properties.

It can be seen that there is a need in the art for a solar cell that has increased efficiency. It can also be seen that there is a need in the art for a solar cell that can use a large range of materials to absorb different wavelengths of light. It can also be seen that there is a need in the art for a solar cell that can use these different materials while still keeping the materials bonded to each other.

SUMMARY OF THE INVENTION

To address the requirements described above, the present invention discloses methods and apparatuses for creating solar cell assemblies with bonded interlayers.

An apparatus in accordance with the present invention comprises two or more subcells bonded together using a Transparent Conductive Coating (TCC). TCC material is deposited on one or more surfaces to bond different subcells together. The TCC provides electrical contact between the two subcells while allowing for optical transmission. The thickness of the TCC may be used in conjunction with other optical coatings to optimize the transmission and reflection between the subcells to maximize the efficiency of the multijunction stack.

The process of using a TCC to bond two adjacent subcells together may be repeated for an arbitrary number of subcells. The TCC may be selected from a group of materials such as zinc oxide, indium zinc oxide, indium tin oxide, indium molybdenum oxide, indium titanium oxide, high-bandgap semiconductors such as GaInP, AlGaInP, AlGaAs, AlGaAsSb, AlInAs, AlGaInSb, AlGaInN, SiC, or ZnSeTe, and other transparent conducting materials in general. It may also be used as part of a dielectric stack to either reflect or transmit light between subcells.

An apparatus in accordance with the present invention comprises a first solar cell, wherein the first solar cell comprises a first Transparent Conductive Coating (TCC) layer coupled to a first polarity electrode of the first solar cell, and a second solar cell, the second solar cell being bonded to the first solar cell by bonding the first TCC layer to the second solar cell.

Such an apparatus further optionally comprises the second solar cell further comprising a second TCC layer, and the first solar cell is bonded to the second solar cell by bonding the first TCC layer to the second TCC layer, the second solar cell further comprising a second polarity electrode, a third solar cell, having a third TCC layer, wherein the third solar cell is bonded to the second solar cell by bonding the third TCC layer to the second solar cell, a dielectric stack, coupled to at least one TCC layer, a material for the first TCC layer being selected from a group comprising zinc oxide, indium zinc oxide, indium tin oxide, indium molybdenum oxide, indium titanium oxide, high-bandgap semiconductors such as GaInP, AlGaInP, AlGaAs, AlGaAsSb, AlInAs, AlGaInSb, AlGaInN, SiC, or ZnSeTe, a material for the second TCC layer being selected from a group comprising zinc oxide, indium zinc oxide, indium tin oxide, indium molybdenum oxide, indium titanium oxide, high-bandgap semiconductors such as GaInP, AlGaInP, AlGaAs, AlGaAsSb, AlInAs, AlGaInSb, AlGaInN, SiC, and ZnSeTe, an optical stack being used between the first cell and the second cell to reflect a range of wavelengths of light back through the second cell, one or more layers made of a transparent conductive material is incorporated into the optical stack, with at least one of a thickness, a position in the optical stack, composition, and an index of refraction of the one or more layers are designed to optimize reflection of a range of wavelengths back through the second cell, an optical stack is used between the first cell and the second cell to maximize light transmission for a range of wavelengths between the second cell and the first cell, and the first solar cell being a multijunction solar cell.

A method in accordance with the present invention comprises forming a first solar cell with a first TCC layer coupled to a first polarity electrode, forming a second solar cell, and bonding the first solar cell to the second solar cell by bonding the first TCC layer to the second solar cell.

Such a method further optionally comprises the second solar cell further comprising a second TCC layer, and the first solar cell is bonded to the second solar cell by bonding the first TCC layer to the second TCC layer, forming a third solar cell, having a third TCC layer coupled to a second polarity electrode of the third solar cell, forming a fourth TCC layer coupled to a first polarity electrode of the second solar cell, and bonding the third solar cell to the second solar cell by bonding the third TCC layer to the fourth TCC layer, a dielectric stack, coupled to at least one TCC layer, the first TCC layer being selected from a group comprising zinc oxide, indium zinc oxide, indium tin oxide, indium molybdenum oxide, indium titanium oxide, GaInP, AlGaInP, AlGaAs, AlGaAsSb, AlInAs, AlGaInSb, AlGaInN, SiC, and ZnSeTe, the second TCC layer being selected from a group comprising zinc oxide, indium zinc oxide, indium tin oxide, indium molybdenum oxide, indium titanium oxide, GaInP, AlGaInP, AlGaAs, AlGaAsSb, AlInAs, AlGaInSb, AlGaInN, SiC, and ZnSeTe, an optical stack being used between the first cell and the second cell to reflect a range of wavelengths of light back through the second cell, one or more layers made of a transparent conductive material being incorporated into the optical stack, with one or more of a thickness, a position in the stack, a composition, and an index of refraction of the one or more layers are designed to optimize reflection of a range of wavelengths back through the second cell, an optical stack being used between the first cell and the second cell to maximize light transmission for a range of wavelengths between the second cell and the first cell, and the first solar cell being a multijunction solar cell.

An alternative embodiment of the present invention comprises a first solar cell, wherein the first solar cell comprises a first bonding layer, and a second solar cell, wherein the second solar cell is bonded to the first solar cell by bonding the first bonding layer to the second solar cell.

Such an embodiment further optionally included the first bonding layer being a Transparent Conductive Coating (TCC) layer, and the first bonding layer being a layer of a dielectric stack and a second bonding layer being another layer of a dielectric stack.

The present invention provides a solar cell that has increased efficiency. The present invention also provides a solar cell that can use a large range of materials to absorb different wavelengths of light. The present invention further provides a solar cell that can use these different materials while still keeping the materials bonded to each other.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The present invention utilizes transparent conductive materials, such as a Transparent Conductive Coating (TCC), in between the subcells of a multijunction solar cell to allow for a mismatch in the lattice constants of the subcell materials. Since the TCC is typically amorphous, the limitation on the lattice constants of the materials used in solar cell manufacture is removed, leaving designers to use materials based on efficiency and wavelength spectrum absorption. Further, use of TCC material frees the designer to choose different substrate materials if desired.

Standard Multijunction Solar Cell

Figure 1:
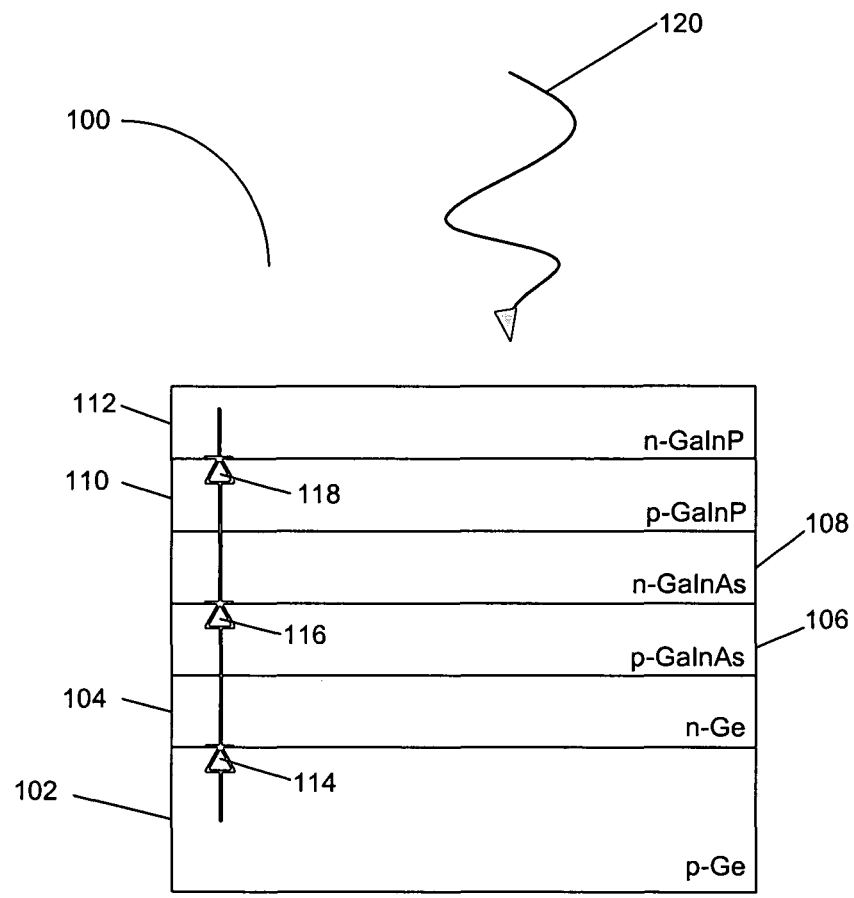
FIG. 1 illustrates a related art multijunction solar cell.

FIG. 1 illustrates a related art multijunction solar cell.

FIG. 1 illustrates a cross-sectional view of a semiconductor device. Assembly 100 comprises substrate 102, and layers 104-112. Substrate 102 is typically a Germanium (Ge) crystalline substrate, and is typically doped with a p-type dopant. Layer 104 is typically an n-type Ge layer, which can be created by epitaxial growth or by diffusion techniques.

Layer 106 is epitaxially grown or otherwise chemically deposited on layer 104, and is typically Gallium Indium Arsenide (GaInAs) that is doped p-type. Similarly, layer 108 is grown or deposited on layer 106, and is typically n-type GaInAs. Layer 110 is grown or deposited on layer 108, and is typically p-type Gallium Indium Phosphide (GaInP), and layer 112 is grown or otherwise deposited on layer 110, and is typically n-type GaInP.

Substrate 102 and layer 104 create a p-n junction, which is shown as diode 114. Similarly, layers 106 and 108 create diode 116, and layers 110 and 112 create diode 118. Additional layers, called tunnel junction layers, are typically grown in between the subcell layers (e.g., between layers 104 and 106, and between layers 108 and 110) to provide an interconnection for the assembly 100.

When light 120 is incident on layer 112, some of the wavelengths present in light 120 are absorbed by layers 110 and 112, and converted to electric current via the photovoltaic effect, at the p-n junction between layers 110 and 112. The wavelengths that are not absorbed are typically transmitted through layers 110 and 112 to layers 106 and 108, which convert different wavelengths of light to electric current, and transmit the unabsorbed wavelengths to layer 104 and substrate 102, where other wavelengths are absorbed. This multijunction assembly 100 is used to maximize the amount of absorption of light 120, and, as such, generate as much voltage and current in a given area of assembly 100 as possible.

However, the growth of GaInAs, and especially GaInP, is difficult and expensive. Further, the compositions of GaInAs and GaInP are chosen for the solar cell arrangement such that the lattice constants of these materials are closely aligned such that the growth or deposition of high-quality GaInAs and GaInP will occur on top of the Ge substrate 102. If a different material were used for substrate 102, e.g., silicon (Si), it would be very difficult to grow GaInAs or GaInP on such a substrate 102 without a dramatic loss of efficiency or mechanical instability of assembly 100. Likewise, the compositions of GaInAs and GaInP are limited to those that are near lattice match to Ge. As such, the material choices for substrate 102 and layers 104-112 are limited to those materials that have nearly matching lattice constants, and is somewhat independent of their ability to absorb more wavelengths of light 120.

Having the three solar subcells shown as layers 104-112 in a single stack together makes the three subcells shown in FIG. 1 a multijunction solar cell.

Transparent Conductive Coating Layers

Figure 2:
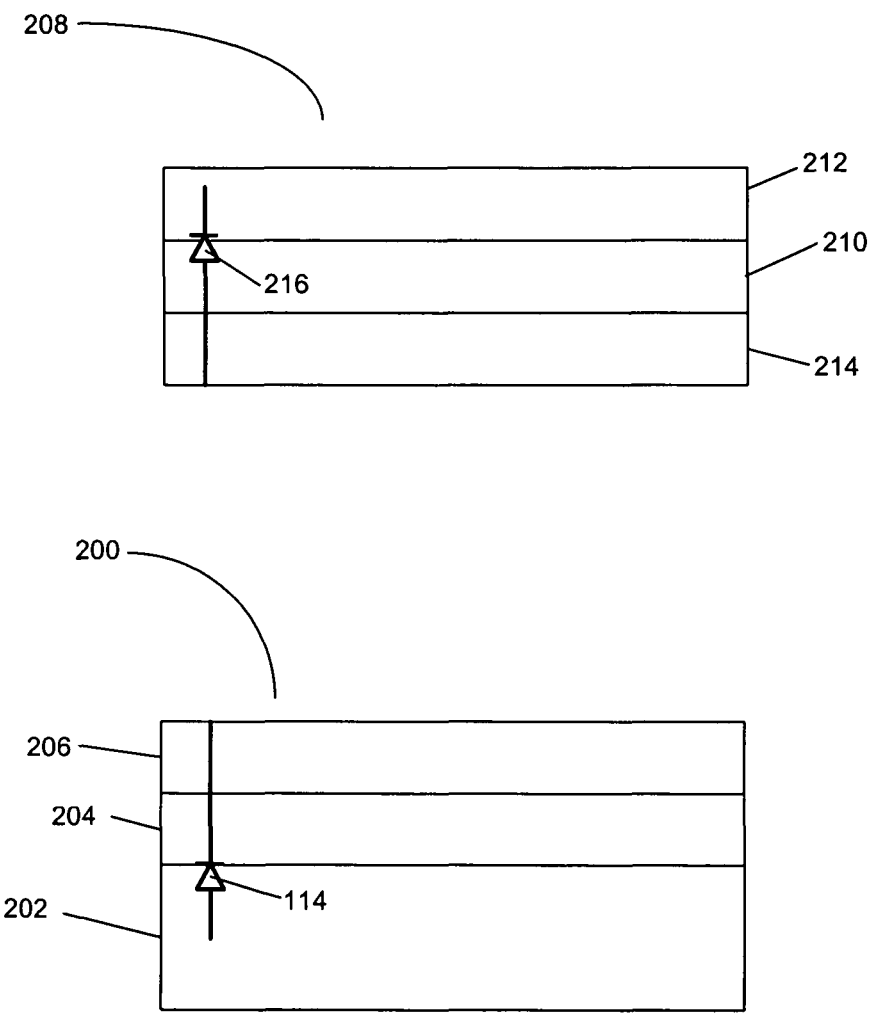
FIG. 2 illustrates a device in accordance with the present invention that integrates a transparent conductive layer with solar cells.

FIG. 2 illustrates a device in accordance with the present invention that integrates a transparent conductive layer with solar cells.

Assembly 200 illustrates a substrate 202 and layers 204 and 206. Substrate 202 is shown doped as p-type, and layer 204 is shown doped as n-type, however, substrate 202 and layer 204 can be doped with either polarity of charge carrier without departing from the scope of the present invention.

Layer 206 is a Transparent Conductive Coating (TCC) layer that is deposited onto layer 204. Typically, layer 206 is amorphous, and, as such, does not have the lattice constant constraints of other materials that might be deposited onto layer 204. Layer 206 is typically zinc oxide, indium zinc oxide, indium tin oxide (ITO), indium molybdenum oxide, indium titanium oxide, high-bandgap semiconductors such as GaInP, AlGaInP, AlGaAs, AlGaAsSb, AlInAs, AlGaInSb, AlGaInN, SiC, or ZnSeTe, and other transparent conducting materials in general. These are typically evaporated onto layer 204, but can also be sputtered or otherwise deposited onto layer 204. Further, layer 206 can also be other materials such as high-bandgap semiconductors, or other materials as desired. Assembly 200 is a single-junction solar cell, which can be used as the basis for a multijunction solar cell in accordance with the present invention.

Assembly 208 shows layer 210, 212, and 214, where layers 210 and 212 form diode 216. Layers 210 and 212 are a second subcell, which can respond to light and form a photovoltaic solar cell as do substrate 202 and layer 204.

Layer 214 is another TCC layer, that is deposited onto layer 210. Preferably, layer 214 is made from the same material as layer 206, but can be another TCC material if desired, e.g., when a dielectric stack or multi-layer coating is being formed on layer 210. For example, layers of materials with varying optical properties might be combined so as to promote bonding as well as optical reflection or transmission. Further, layer 214 is optional, depending on the design of assembly 200.

Layer 214, if present, and layer 206 are then bonded together using heat and/or pressure applied between assembly 200 and assembly 208. If layer 214 is not present, then layer 206 is bonded directly to layer 210. For example, and not by way of limitation, assemblies 200 and 208 are placed in a vacuum chamber, which is then evacuated such that air or other particles are not trapped between assemblies 200 and 208. Assemblies 200 and 208 are placed such that layer 214 (if present) is placed in contact with layer 206, and heat and/or pressure is applied to assemblies 200 and 208 such that layers 206 and 214 bond together.

Alternatively, bonding might be accomplished using only a single TCC; that is, either layer 206 or 214.

Figure 3:
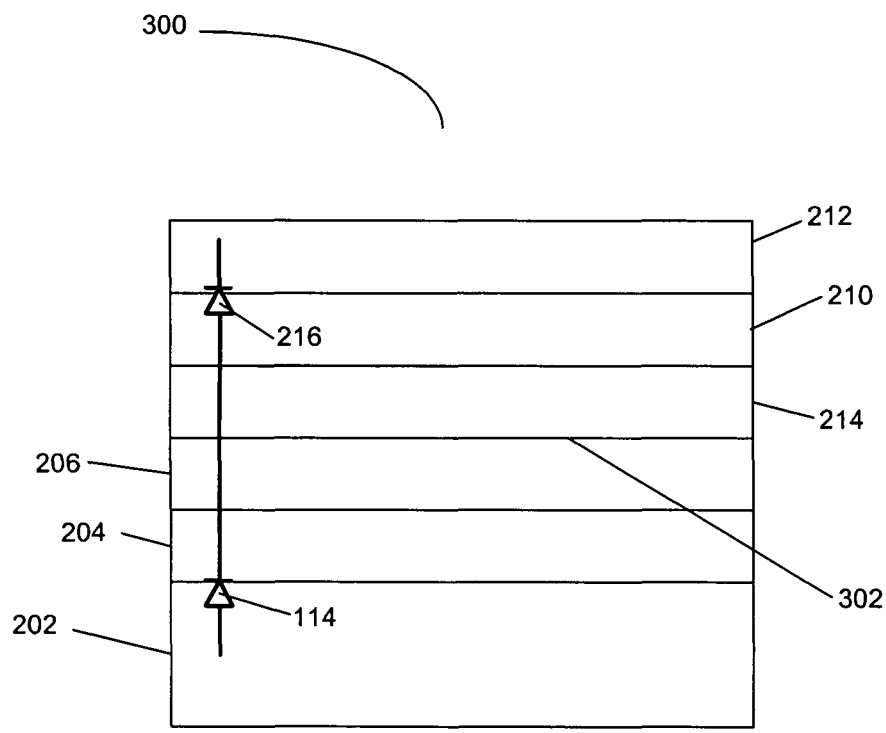
FIG. 3 illustrates a bonded subassembly of the present invention.

FIG. 3 illustrates a bonded subassembly of the present invention.

Bonded subassembly 300 illustrates a single subassembly comprising assemblies 200 and 208 shown in FIG. 2. Layers 206 and 214 are now bonded together at interface 302.

The TCC layers, i.e., layers 206 and 214, can be designed to optimize the reflectance and transmittance properties of the bonded TCC layers 206 and 214. For example, and not by way of limitation, layers 206 and 214 can have different transmissive and/or reflective properties than other TCC layers in a given multifunction cell assembly 300, because the light that passes through these layers to layers 204 and 202 is of a different wavelength range than other layers (e.g., layers 212 and 210) used in the assembly 300.

Interference effects due to the different refractive indices of the TCC layers 206 and 214, as well as other layers at and near the bonded interface 302 can be employed to maximize light transmission to assembly 200 (also called a subcell), namely, layers 202 and 204 which are the active layers of assembly 200, beneath the bond interface 302 (e.g., an anti-reflection coating using TCC layers between subcells). Further, layers 206 and 214 can be used to increase the reflectance of this interface 302 for certain wavelengths of light, so that such light is reflected back into the subcell(s) above the bonded layers 206 and 214, e.g. to layers 210 and 212, which will give such reflected light a greater chance of being absorbed in layers 210 and 212. Such a reflectance typically increases the efficiency of bonded assembly 300.

Layers 206 and 214, and interface 302, can also be used to accomplish maximum light transmission to the lower subcell(s), e.g., layers 202 and 204, in some regions of the incident light spectrum and high reflectance back into the upper subcell(s), e.g., layers 210 and 212 for other regions of the spectrum, to maximize the power output of the multijunction cell assembly 300 as a whole. The reflection and transmission functions may be accomplished in several ways, e.g., by optimizing the thickness of the overall bonded TCC layers 206 and 214, by combining the TCC layers 206 and 214 with other transparent layers such as dielectric materials with different refractive indices than the TCC layers 206 and 214, with thickness chosen to optimize the interference effects in the overall transparent stack, by combining TCC layers 206 and 214 with different refractive indices in the bonded structure, with thicknesses chosen to optimize the interference effects in the overall transparent stack, or by combining TCC layers 206 and 214 with different refractive indices, non-conducting transparent materials such as dielectrics, or thin, transparent metal or semiconductor layers in the stack, to achieve the desired transmission/reflection characteristics of the layers in assembly 300.

Triple-Junction TCC Bonded Solar Cell

Figure 4:
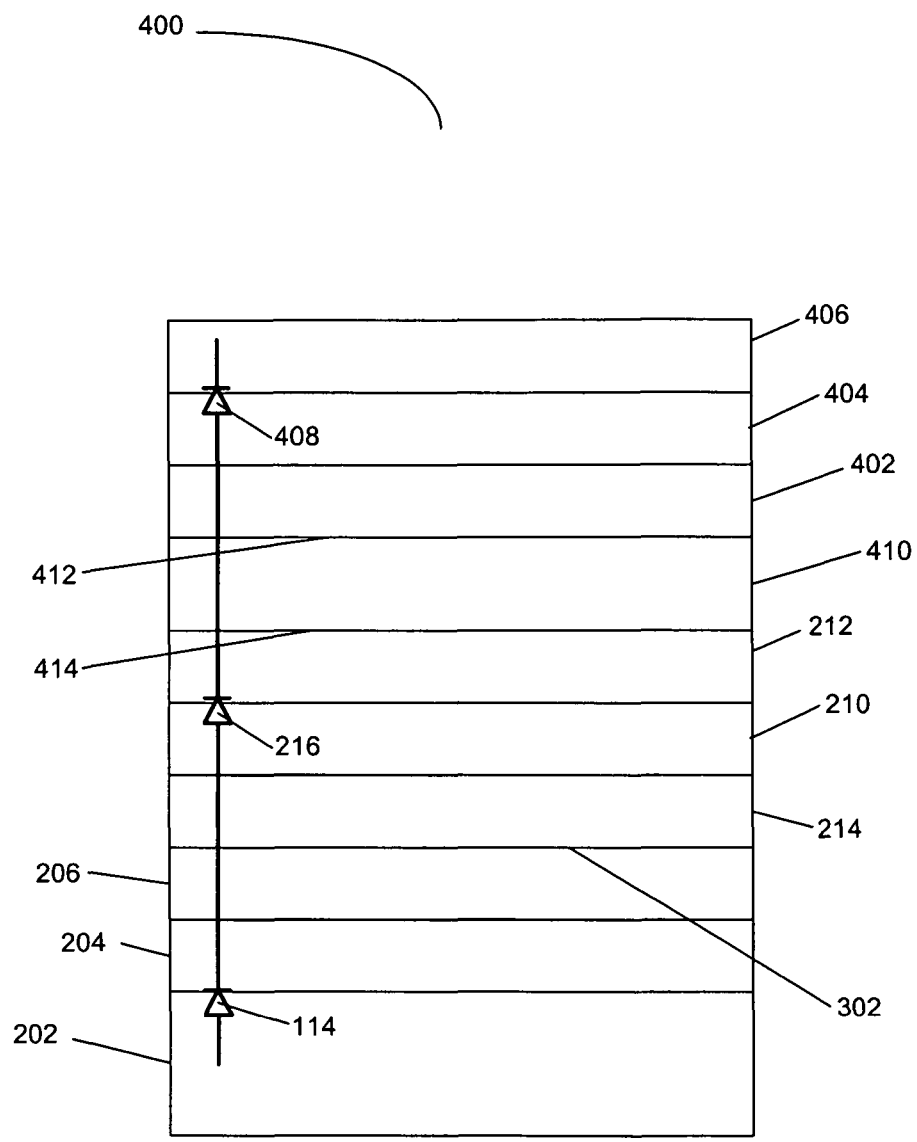
FIG. 4 illustrates a triple-junction TCC-bonded solar cell assembly in accordance with the present invention.

FIG. 4 illustrates a triple-junction TCC bonded solar cell assembly in accordance with the present invention.

Assembly 400 is a triple-junction solar cell, with layers 402-406 shown. Diode 408 is created by layers 404 and 406. Layer 402 is a TCC layer attached to the anode of diode 408, specifically to layer 404. Layer 410 is an optional dielectric stack placed on layer 212 at interface 414, although part or all of layer 410 can be attached to layer 402 if desired. Layer 410 can also be a TCC layer that is coupled first to layer 212, which then can be bonded to layer 402. Layer 402 can also be bonded directly to layer 212 if desired.

Layer 410 is then bonded to layer 402 at interface 412 as described above with respect to interface 302. Layer 410 can be bonded to layer 402 at the same time as interface 302 is created, or can be done sequentially, to allow for testing of assembly 300 shown in FIG. 3 prior to the bonding of layers 410 and 402. For example, and not by way of limitation, if assembly 300 does not pass certain tests, bonding of layer 410 to layer 212 would be a wasted processing step, and can be skipped, since the underlying assembly 300 may not be a working solar cell.

Layer 410 can also provide reflective and/or transmissive qualities to the assembly 400, which allows some frequencies of light to pass through layer 410 such that the layers 212 and 210 and layers 202 and 204 can absorb such frequencies. A second dielectric stack can be placed at interface 302 if desired without departing from the scope of the present invention, to further reflect and/or transmit certain frequencies of light throughout assembly 400.

Further, assembly 400 can be manufactured by creating a dual-junction solar cell using layers 202-212 in a related art manner, and bonding only the third cell in assembly 400 using TCC layers 410 and 402, or using a dielectric stack as part of either TCC layer 410, TCC layer 402, or both TCC layers 402 and 410. In other words, the underlying solar cell assembly is already a multijunction solar cell, and the bonding of another subcell assembly takes place on top of the multijunction cell. This process is modular and may be extended to multijunction cells with 4, 5, 6, and more junctions.

Process Chart

Figure 5:
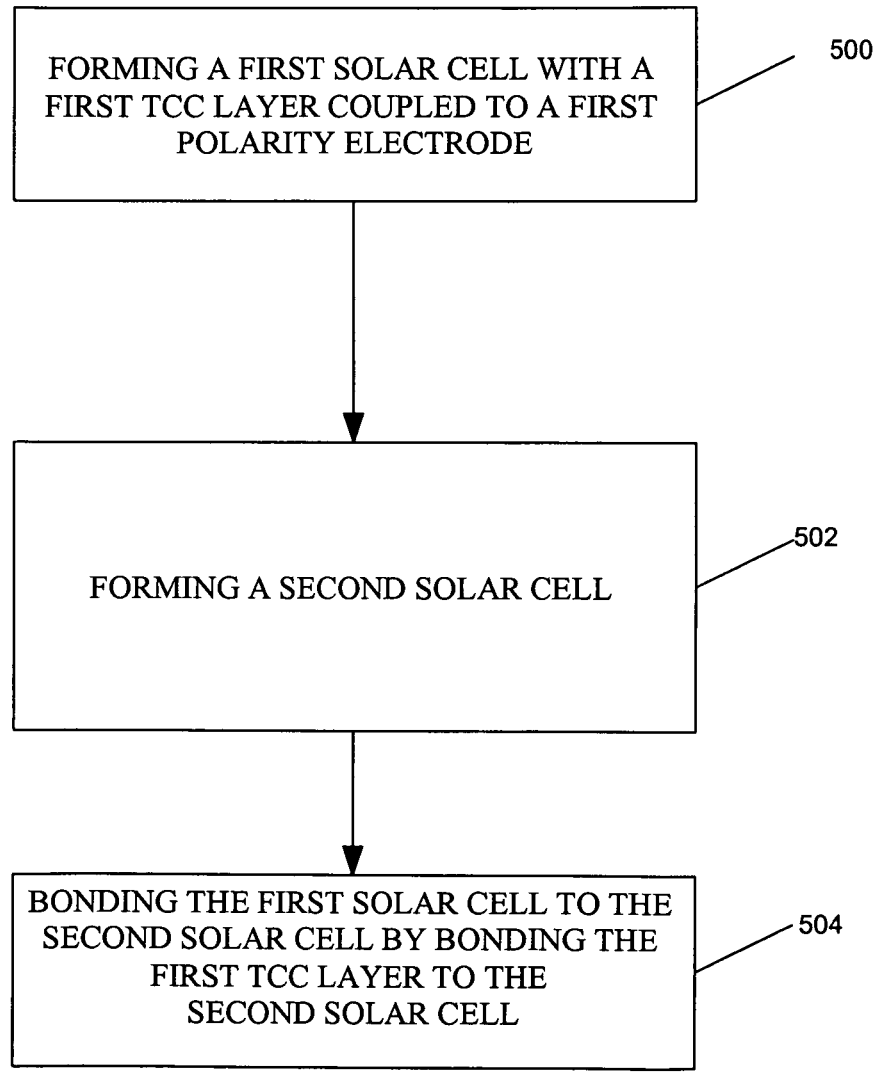
FIG. 5 is a flow chart showing the operations used to practice one embodiment of the present invention.

FIG. 5 is a flow chart showing the operations used to practice one embodiment of the present invention.

Box 500 illustrates forming a first solar cell with a first TCC layer coupled to a first polarity electrode.

Box 502 illustrates forming a second solar cell.

Box 504 illustrates bonding the first solar cell to the second solar cell by bonding the first TCC layer to the second solar cell.

Conclusion

This concludes the description of the preferred embodiments of the present invention. In summary, the present invention describes an apparatus and method for making a solar cell assembly with transparent conductive bonding interlayers.

As described herein, the substrate is typically a germanium substrate, however, any semiconductor substrate, such as germanium, GaAs, InP, Si, GaSb, GaP, GaN, SiC, or other semiconductor materials can be used for the substrate material without departing from the scope of the present invention. Further, any polarity type can be used for the substrate and/or solar cell junctions, i.e., p-type and n-type materials can be changed as long as p-n junctions are formed in the proper manner. It is also possible to bond like polarity layers together if desired without departing from the scope of the present invention.

An apparatus in accordance with the present invention comprises a first solar cell, wherein the first solar cell comprises a first Transparent Conductive Coating (TCC) layer coupled to a first polarity electrode of the first solar cell, and a second solar cell, the second solar cell being bonded to the first solar cell by bonding the first TCC layer to the second solar cell.

Such an apparatus further optionally comprises the second solar cell further comprising a second TCC layer, and the first solar cell is bonded to the second solar cell by bonding the first TCC layer to the second TCC layer, the second solar cell further comprising a second polarity electrode, a third solar cell, having a third TCC layer, wherein the third solar cell is bonded to the second solar cell by bonding the third TCC layer to the second solar cell, a dielectric stack, coupled to at least one TCC layer, a material for the first TCC layer being selected from a group comprising zinc oxide, indium zinc oxide, indium tin oxide, indium molybdenum oxide, indium titanium oxide, high-bandgap semiconductors such as GaInP, AlGaInP, AlGaAs, AlGaAsSb, AlInAs, AlGaInSb, AlGaInN, SiC, or ZnSeTe, a material for the second TCC layer being selected from a group comprising zinc oxide, indium zinc oxide, indium tin oxide, indium molybdenum oxide, indium titanium oxide, high-bandgap semiconductors such as GaInP, AlGaInP, AlGaAs, AlGaAsSb, AlInAs, AlGaInSb, AlGaInN, SiC, and ZnSeTe, an optical stack being used between the first cell and the second cell to reflect a range of wavelengths of light back through the second cell, one or more layers made of a transparent conductive material is incorporated into the optical stack, with at least one of a thickness, a position in the optical stack, composition, and an index of refraction of the one or more layers are designed to optimize reflection of a range of wavelengths back through the second cell, an optical stack is used between the first cell and the second cell to maximize light transmission for a range of wavelengths between the second cell and the first cell, and the first solar cell being a multijunction solar cell.

A method in accordance with the present invention comprises forming a first solar cell with a first TCC layer coupled to a first polarity electrode, forming a second solar cell, and bonding the first solar cell to the second solar cell by bonding the first TCC layer to the second solar cell.

These processes may be repeated for an arbitrary number of subcells. Multijunction cells having two, three, four, five, six, or more subcells joined this way are possible. The TCC may be selected from a group of materials such as zinc oxide, indium zinc oxide, and indium tin oxide. It may also be used as part of a dielectric stack to reflect and/or transmit light between subcells.

Such a method further optionally comprises the second solar cell further comprising a second TCC layer, and the first solar cell is bonded to the second solar cell by bonding the first TCC layer to the second TCC layer, forming a third solar cell, having a third TCC layer coupled to a second polarity electrode of the third solar cell, forming a fourth TCC layer coupled to a first polarity electrode of the second solar cell, and bonding the third solar cell to the second solar cell by bonding the third TCC layer to the fourth TCC layer, a dielectric stack, coupled to at least one TCC layer, the first TCC layer being selected from a group comprising zinc oxide, indium zinc oxide, indium tin oxide, indium molybdenum oxide, indium titanium oxide, GaInP, AlGaInP, AlGaAs, AlGaAsSb, AlInAs, AlGaInSb, AlGaInN, SiC, and ZnSeTe, the second TCC layer being selected from a group comprising zinc oxide, indium zinc oxide, indium tin oxide, indium molybdenum oxide, indium titanium oxide, GaInP, AlGaInP, AlGaAs, AlGaAsSb, AlInAs, AlGaInSb, AlGaInN, SiC, and ZnSeTe, an optical stack being used between the first cell and the second cell to reflect a range of wavelengths of light back through the second cell, one or more layers made of a transparent conductive material being incorporated into the optical stack, with one or more of a thickness, a position in the stack, a composition, and an index of refraction of the one or more layers are designed to optimize reflection of a range of wavelengths back through the second cell, an optical stack being used between the first cell and the second cell to maximize light transmission for a range of wavelengths between the second cell and the first cell, and the first solar cell being a multifunction solar cell.

An alternative embodiment of the present invention comprises a first solar cell, wherein the first solar cell comprises a first bonding layer, and a second solar cell, wherein the second solar cell is bonded to the first solar cell by bonding the first bonding layer to the second solar cell.

Such an embodiment further optionally included the first bonding layer being a Transparent Conductive Coating (TCC) layer, and the first bonding layer being a layer of a dielectric stack and a second bonding layer being another layer of a dielectric stack.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and the equivalents thereof.

What is claimed is:

1. A solar cell assembly, comprising:
a first solar cell comprised of a first p-type doped semiconductor layer and a first n-type doped semiconductor layer forming a first p-n junction, a second solar cell comprised of a second p-type doped semiconductor layer and a second n-type doped semiconductor layer forming a second p-n junction, and a first Transparent Conductive Coating (TCC) layer, deposited on or above the first n-type doped semiconductor layer of the first solar cell and bonded to the second p-type doped semiconductor layer of the second solar cell, or deposited on or above the first p-type doped semiconductor layer of the first solar cell and bonded to the second n-type doped semiconductor layer of the second solar cell, for electrically connecting the first solar cell to the second solar cell, wherein:

the first TCC layer is a Transparent Conductive Oxide (TCO) that is amorphous to allow for a mismatch in lattice constants between the first and second solar cells;

the first TCC layer creates an interference effect that alters light travelling between the first solar cell and the second solar cell and increases efficiency of light absorbed in at least one of the first solar cell and the second solar cell; and the interference effect of the first TCC layer increases transmission of the light to the first solar cell and increases reflectance of the light back into the second solar cell.

2. The solar cell assembly of claim 1, further comprising a second TCC layer, deposited on or above the second p-type doped semiconductor layer of the second solar cell, or deposited on or above the second n-type doped semiconductor layer of the second solar cell, wherein the first solar cell is bonded to the second solar cell by bonding the first TCC layer to the second TCC layer.

3. The solar cell assembly of claim 2, further comprising a third solar cell comprised of a third p-type doped semiconductor layer and a third n-type doped semiconductor layer forming a third p-n junction, having a third TCC layer, deposited on or above the second n-type doped semiconductor layer of the second solar cell and bonded to the third p-type doped semiconductor layer of the third solar cell, or deposited on or above the second p-type doped semiconductor layer of the second solar cell and bonded to the third n-type doped semiconductor layer of the third solar cell, for electrically connecting the second solar cell to the third solar cell.

4. The solar cell assembly of claim 3, further comprising a dielectric stack, coupled to at least one of the first, second or third TCC layers.

5. The solar cell assembly of claim 4, wherein a material for the first TCC layer is selected from a group comprising zinc oxide, indium zinc oxide, indium tin oxide, indium molybdenum oxide, and indium titanium oxide.

6. The solar cell assembly of claim 5, wherein a material for the second TCC layer is selected from a group comprising zinc oxide, indium zinc oxide, indium tin oxide, indium molybdenum oxide, and indium titanium oxide.

7. The solar cell assembly of claim 6, wherein an optical stack is used between the first solar cell and the second solar cell to reflect a range of wavelengths of light back through the second solar cell.

8. The solar cell assembly of claim 7, wherein one or more layers made of a transparent conduction material is incorporated into the optical stack, with at least one of a thickness, a position in the optical stack, composition, and an index of refraction of the one or more layers are designed to optimize reflection of a range of wavelengths back through the second solar cell.

9. The solar cell assembly of claim 6, wherein an optical stack is used between the first solar cell and the second solar cell to maximize light transmission for a range of wavelengths between the second solar cell and the first solar cell.

10. The solar cell assembly of claim 1, wherein the first solar cell is a multijunction solar cell.

11. A method for making a solar cell assembly, comprising:

forming a first solar cell comprised of a first p-type doped semiconductor layer and a first n-type doped semiconductor layer forming a first p-n junction;

forming a second solar cell comprised of a second p-type doped semiconductor layer and a second n-type doped semiconductor layer forming a second p-n junction; and bonding the first solar cell to the second solar cell using a first Transparent Conductive Coating (TCC) layer, deposited on or above the first n-type doped semiconductor layer of the first solar cell and bonded to the second p-type doped semiconductor layer of the second solar cell, or deposited on or above the first p-type doped semiconductor layer of the first solar cell and bonded to the second n-type doped semiconductor layer of the second solar cell, for electrically connecting the first solar cell to the second solar cell, wherein the first TCC layer is a Transparent Conductive Oxide (TCO) that is amorphous to allow for a mismatch in lattice constants between the first and second solar cells, the first TCC layer creates an interference effect that alters light travelling between the first solar cell and the second solar cell and increases efficiency of light absorbed in at least one of the first solar cell and the second solar cell, and the interference effect of the first TCC layer increases transmission of the light to the first solar cell and increases reflectance of the light back into the second solar cell.

12. The method of claim 11, further comprising a second TCC layer, deposited on or above the second p-type doped semiconductor layer of the second solar cell, or deposited on or above the second n-type doped semiconductor layer of the second solar cell, wherein the first solar cell is bonded to the second solar cell by bonding the first TCC layer to the second TCC layer.

13. The method of claim 12, further comprising:

forming a third solar cell comprised of a third p-type doped semiconductor layer and a third n-type doped semiconductor layer forming a third p-n junction, having a third TCC layer, deposited on or above the third p-type doped semiconductor layer of the third solar cell or deposited on or above the third n-type doped semiconductor layer of the third solar cell;

forming a fourth TCC layer, deposited on or above the second n-type doped semiconductor layer of the second solar cell or deposited on or above the second p-type doped semiconductor layer of the second solar cell; and bonding the third solar cell to the second solar cell by bonding the third TCC layer to the fourth TCC layer.

14. The method of claim 13, further comprising a dielectric stack, coupled to at least one of the first, second or third TCC layers.

15. The method of claim 14, wherein the first TCC layer is selected from a group comprising zinc oxide, indium zinc oxide, indium tin oxide, indium molybdenum oxide, and indium titanium oxide.

16. The method of claim 15, wherein the second TCC layer is selected from a group comprising zinc oxide, indium zinc oxide, indium tin oxide, indium molybdenum oxide, and indium titanium oxide.

17. The method of claim 11, wherein an optical stack is used between the first solar cell and the second solar cell to reflect a range of wavelengths of light back through the second solar cell.

18. The method of claim 17, wherein one or more layers made of a transparent conduction material is incorporated into the optical stack, with one or more of a thickness, a position in the stack, a composition, and an index of refraction of the one or more layers are designed to optimize reflection of a range of wavelengths back through the second solar cell.

19. The method of claim 18, wherein an optical stack is used between the first solar cell and the second solar cell to maximize light transmission for a range of wavelengths between the second solar cell and the first solar cell.

20. The method of claim 11, wherein the first solar cell is a multijunction solar cell.

21. A solar cell assembly, comprising:
a first solar cell comprised of a first p-type doped semiconductor layer and a first n-type doped semiconductor layer forming a first p-n junction,
a second solar cell comprised of a second p-type doped semiconductor layer and a second n-type doped semiconductor layer forming a second p-n junction, and
a first bonding layer, deposited on or above the first n-type doped semiconductor layer of the first solar cell and bonded to the second p-type doped semiconductor layer of the second solar cell, or deposited on or above the first p-type doped semiconductor layer of the first solar cell and bonded to the second n-type doped semiconductor layer of the second solar cell, for electrically connecting the first solar cell to the second solar cell, wherein:
the first bonding layer is a Transparent Conductive Oxide (TCO) that is amorphous to allow for a mismatch in lattice constants between the first and second solar cells,
the first bonding layer creates an interference effect that alters light travelling between the first solar cell and the second solar cell and increases efficiency of light absorbed in at least one of the first solar cell and the second solar cell, and
the interference effect of the first bonding layer increases transmission of the light to the first solar cell and increases reflectance of the light back into the second solar cell.

22. The solar cell assembly of claim 21, wherein the first bonding layer is a Transparent Conductive Coating (TCC) layer.

23. The solar cell assembly of claim 21, wherein the first bonding layer is a layer of a dielectric stack and a second bonding layer is another layer of a dielectric stack.

24. The solar cell assembly of claim 1, wherein the first TCC layer has one or more of a thickness, position, composition and index of refraction that creates the interference effect that alters light travelling between the first solar cell and the second solar cell and increases efficiency of light absorbed in at least one of the first solar cell and the second solar cell.

25. The method of claim 11, wherein the first TCC layer has one or more of a thickness, position, composition and index of refraction that creates the interference effect that alters light travelling between the first solar cell and the second solar cell and increases efficiency of light absorbed in at least one of the first solar cell and the second solar cell.

26. The solar cell assembly of claim 21, wherein the first bonding layer has one or more of a thickness, position, composition and index of refraction that creates the interference effect that alters light travelling between the first solar cell and the second solar cell and increases efficiency of light absorbed in at least one of the first solar cell and the second solar cell.

* * * * *